(12) United States Patent
Katoh

(10) Patent No.: US 8,030,797 B2
(45) Date of Patent: Oct. 4, 2011

(54) APPARATUS, CIRCUIT AND METHOD OF WIRING FOR SUPPLYING POWER

(75) Inventor: Toshihiro Katoh, Tokyo (JP)

(73) Assignee: NEC Corporation, Tokyo (JP)

( * ) Notice: Subject to any disclaimer, the term of this patent is extended or adjusted under 35 U.S.C. 154(b) by 532 days.

(21) Appl. No.: 12/222,590

(22) Filed: Aug. 12, 2008

(65) Prior Publication Data
US 2009/0066160 A1    Mar. 12, 2009

(30) Foreign Application Priority Data
Sep. 7, 2007 (JP) .................... 2007-233096

(51) Int. Cl.
*H02J 1/10* (2006.01)
(52) U.S. Cl. .......................................... 307/43
(58) Field of Classification Search ............. 307/43, 307/69; 257/207
See application file for complete search history.

(56) References Cited

U.S. PATENT DOCUMENTS

2003/0001171 A1* 1/2003 Banno et al. .................. 257/207
2006/0103421 A1* 5/2006 Hirata ............................ 326/62

FOREIGN PATENT DOCUMENTS

| JP | 9-213887 | 8/1997 |
| JP | 11-204649 | 7/1999 |
| JP | 2006-54235 | 2/2006 |
| JP | 2006-245384 | 9/2006 |
| JP | 2006-318967 | 11/2006 |

* cited by examiner

*Primary Examiner* — Jared Fureman
*Assistant Examiner* — Carlos Amaya
(74) *Attorney, Agent, or Firm* — McGinn IP Law Group, PLLC

(57) ABSTRACT

An apparatus includes a plurality of wirings, a first power supply to provide a first power to at least one of the wirings, the first power supply being connected to the at least one of the wirings, and a second power supply to provide a second power to at least one of the wirings except that which is connected to the first power supply.

32 Claims, 6 Drawing Sheets

APPARATUS, CIRCUIT AND METHOD OF WIRING FOR SUPPLYING POWER

INCORPORATION BY REFERENCE

This application is based upon and claims the benefit of priority from Japanese patent application No. 2007-233096, filed on Sep. 7, 2007, the disclosure of which is incorporated herein in its entirety by reference.

BACKGROUND OF THE INVENTION

1. Field of the Invention

The present invention relates to a circuit for providing a power to a circuit block, e.g., a clock circuit and logic circuit.

2. Description of Related Art

In a semiconductor integrated circuit, accompanied by a high velocity of a clock, an improvement of a clock skew is required. Causes of the clock skew include, an error caused when the semiconductor integrated circuit is designed, a uniformity in a manufacturing process of the semiconductor integrated circuit, a clock jitter, or the like. Especially, the clock jitter due to a noise caused by a power supply may be a large part of the cause of the clock skew. By preventing a transmission of the noise caused by the power supply for a logic circuit to a clock circuit, the clock jitter may be reduced. However, when it is attempted to separate the power supply of the clock circuit from the power supply of the logic circuit, manufacturing processes and a circuit space may be increased because of the separation of the power supplies.

A clock distribution circuit of the semiconductor integrated circuit has often been designed by using a design tool popularly known as CTS (Clock Tree Synthesis). In this case, since the clock circuit is disposed in a same area for a standard cell (SC) of the logic circuit, it is impossible to separate the power supply of the clock circuit and the power supply of the logic circuit.

Further, to separate the power supply of the clock circuit from the power supply of the logic circuit, the clock circuit is designed as a specific circuit block (e.g., macro block) rather than the standard cell of the logic circuit, the specific block is located so as not to intervene in the standard cell, and then the power supply and a ground for the clock circuit are separated from those of the standard cell of the logic circuit. However, the specific block of the clock circuit is not able to be located in an area for the standard cell of the logic circuit.

Further, since the ground of the clock circuit and the ground of the logic circuit are separated and a resistor is added for connecting the ground and the clock circuit, a potential difference is generated between the ground for the clock circuit and the ground for the logic circuit by the noise of the power supply. By the potential difference, a discrepancy is caused between a threshold voltage of a transistor for the clock circuit and a threshold voltage of a transistor for the logic circuit, thereby to cause a skew.

In a semiconductor integrated circuit, when the standard cells of the clock circuit and the logic circuit are disposed without distinction, the clock skew is generated by the noise caused by the power supply of the logic circuit.

As clock frequency becomes higher, the clock skew becomes larger. Therefore, the technique for separating the power supply of the clock circuit from the power supply of the logic circuit is used for reducing the clock skew.

FIG. 6 shows a related art for separating the power supply of the clock circuit from the power supply of the logic circuit. In the related art, the power supply of the logic circuit is eliminated partially, and the macro block of the clock circuit is placed at the partially eliminated region.

In FIG. 6, reference numeral 41 shows the eliminated region, and reference numeral 42 shows the macro block of the clock circuit disposed at the eliminated region 41.

In the related art, since the macro block of the clock circuit needs to be designed, a design process of the semiconductor integrated circuit increases. Also, since it is required to eliminate the region, the design process of the semiconductor integrated circuit increases. Further, since a process for connecting the macro block and the power supply is required, the design process of the semiconductor integrated circuit increases.

The eliminated region needs to be larger than a size of the macro block of the clock circuit. As a result, in the eliminated region, there may be a region that a circuit element cannot be placed. Therefore, as the clock circuit size increases, the eliminated region of the power supply of the logic circuit increases, and then it becomes difficult to provide the power to the logic circuit.

Patent Document 1 discloses the technique for separating the power supply line. The drain side power supply lines between a circuit block A and a circuit block B which are separated in the power supply are connected by a plurality of resistors R. The source side power supply lines between the circuit block A and the circuit block B are connected by a plurality of resistors R. Signal propagation elements B1 and B2 are disposed by corresponding to the connecting points of each resistor R. A signal transmitted between the circuit block A and the circuit block B is transmitted through the signal propagation elements B1 and B2.

In the Patent Document 1, a malfunction caused by the power supply noise may be reduced independently of the frequency of the signal propagated between the circuit block A and the circuit block B. The signal propagated between the circuit block A and the circuit block B may be stable without installing a specific circuit, such as a low pass filter and a high frequency clock generating circuit, into an LSI.

In the Patent Document 1, the power supply of the clock circuit is connected to the power supply of the logic circuit. Therefore, in the Patent Document 1, the power supply of the clock circuit is not separated from the power supply of the logic circuit.

In Patent Document 2, a capacitor for a power supply and a clock driver are installed at a region under a wiring for supplying power. Therefore, the power is stably supplied from the power supply.

In Patent Document 3, a first wiring for supplying power to a logic circuit and a second wiring for supplying power to a clock circuit are installed in an LSI. A power supply for supplying the power to the first and the second wirings are installed on a first layer, the first layer being different from the second layer on which the first or second wiring is installed. Therefore, a power supply noise caused by the logic circuit is reduced, and thus a clock jitter is reduced.

In Patent Document 4, a design process of a clock circuit is disclosed. In the design process, re-design of a layout of the clock circuit is not required each time when a layout of a circuit other than the clock circuit is re-designed. Therefore, since re-design for laying-out the clock circuit is not required, factors affecting performance of the LSI, such as a clock jitter, are easily predictable.

In Patent Document 5, a power supply for a clock buffer cell which provides a clock signal and a power supply for a sub-clock buffer cell which provides a clock signal, are separated with each other. Each power supply is connected to another power source. Therefore, an influence caused by a power supply noise is dispersed, and thus a delay of the clock buffer cell and the sub-clock buffer cell is decreased.

[Patent Document 1] Japanese Patent Laid-Open No. 2006-054235

[Patent Document 2] Japanese Patent Laid-Open No. 2006-245384

[Patent Document 3] Japanese Patent Laid-Open No. 2006-318967

[Patent Document 4] Japanese Patent Laid-Open No. 9-213887

[Patent Document 5] Japanese Patent Laid-Open No. 11-204649

SUMMARY OF THE INVENTION

According to one exemplary aspect of the present invention, an apparatus, includes a plurality of wirings, a first power supply to provide a first power to at least one of the wirings, the first power supply is connected to at least one of the wirings, and a second power supply to provide a second power to at least one of the wirings except that which is connected to the first power supply.

According to another exemplary aspect of the present invention, a circuit, includes a plurality of wirings, a first power supply to provide a first power to at least one of the wirings, the first power supply is connected to at least one of the wirings, and a second power supply to provide a second power to at least one of the wirings except that which is connected to the first power supply.

According to another exemplary aspect of the present invention, a method, includes laying out a plurality of wirings, laying out a first power supply to provide a first power to at least one of the wirings, the first power supply is connected to at least one of the wirings, and laying out a second power supply to provide a second power to at least one of the wirings except that which is connected to the first power supply.

BRIEF DESCRIPTION OF THE DRAWINGS

Other exemplary aspects and advantages of the invention will be made more apparent by the following detailed description and the accompanying drawings, wherein.

DETAILED DESCRIPTION OF THE EXEMPLARY EMBODIMENT

In an exemplary embodiment of the present invention, ground (GND) wirings are laid out substantially parallel with each other. A pitch between each of the ground wirings is a predetermined pitch. VDD wirings for a logic circuit or VDD wirings for a clock circuit are laid out substantially parallel with each other. A pitch between each of the VDD wirings is substantially the same pitch as for the ground wirings.

Figure 1:
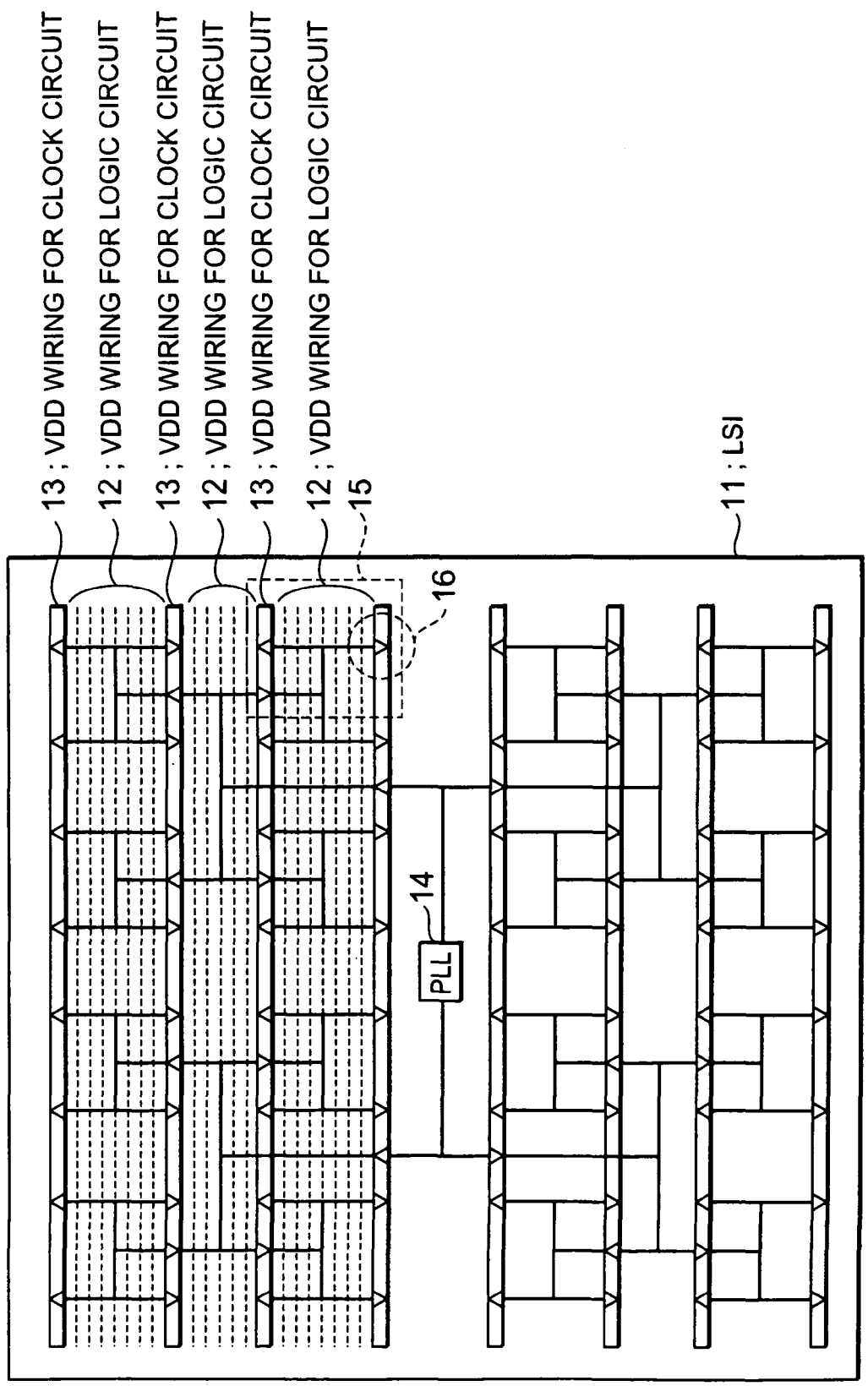
FIG. 1 shows an exemplary configuration of an exemplary embodiment of the present invention.

In FIG. 1, reference numeral 11 denotes an LSI mounted with the semiconductor integrated circuit of the present exemplary embodiment. Reference numeral 12 denotes the VDD wiring for the logic circuit, which may be made of a direct current power supply for logic circuit operation. Reference numeral 13 denotes VDD wiring for the clock circuit. The clock circuit is connected to the VDD wiring for the clock circuit. The clock circuit is connected to a PLL (Phase Locked Loop) 14 serving as a clock generating source. The PLL 14 performs processing such as multiplication for an external clock signal supplied from outside of the LSI, so as to generate a clock signal to be supplied to the entire semiconductor integrated circuit. The clock signal may be supplied directly from the outside without using the PLL. Reference numeral 15 denotes a region which performs a local clock distribution, and reference numeral 16 denotes a clock distribution structure which is a tournament (tree)-like structure. The local clock distribution region 15 and the clock distribution structure 16 will be described in detail in the description of FIG. 2.

In FIG. 1, the illustration of the ground (GND) wiring is omitted.

The VDD wiring for the clock circuit 13 is disposed on the LSI 11 at the predetermined pitch. The clock signal is distributed to each of the clock circuits through a clock wiring which is shaped like an "H" (hereinafter, called "wirings of the H Tree"). In FIG. 1, a triangle-shaped mark denotes the clock circuit.

Figure 2:
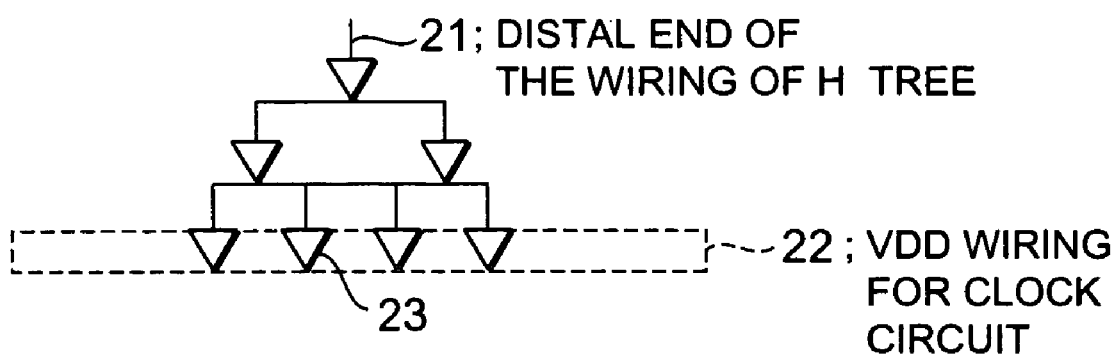
FIG. 2 shows an exemplary configuration for clock signal distribution of an exemplary embodiment of the present invention.

FIG. 2 shows a configuration when the clock is further locally distributed at the distal end of the wirings of the H Tree. As illustrated, the clock branches out in order from the distal end 21 of the wiring of the H tree, and forms the clock distribution structure in the same direction as a VDD wiring for the clock circuit 22, thereby to connect a clock circuit 23 to the VDD wiring for the clock circuit 22.

Figure 3:
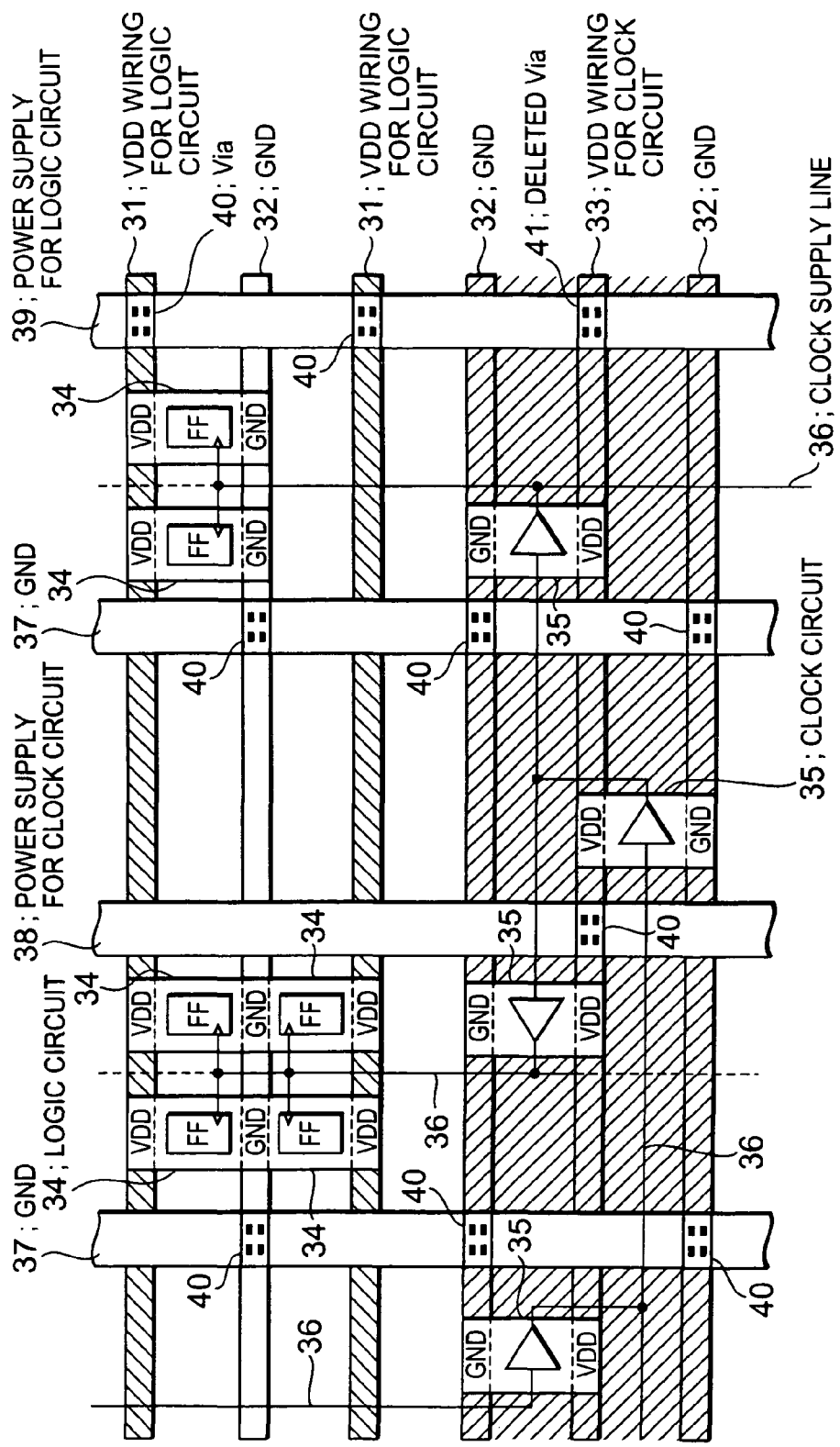
FIG. 3 shows an exemplary configuration of an exemplary embodiment of the present invention.

FIG. 3 shows an example of a layout wiring in the semiconductor integrated circuit of the present exemplary embodiment, and displays a part of the LSI 11 mounted with the semiconductor integrated circuit.

In FIG. 3, a lateral row 31 denotes the VDD wiring for the logic circuit, a lateral row 32 a ground (GND), and a lateral row 33 a VDD wiring for the clock circuit. A logic circuit 34 is placed along the VDD wiring for the logic circuit 31 and the GND 32, and a clock circuit 35 is placed along the GND 32 and the VDD wiring for the clock circuit 33. A clock supply line 36 propagates the clock signal to the clock circuit 35. All these elements may be disposed in a first layer.

A longitudinal row 37 denotes a GND connected to the outside of the LSI 11. The GND 37 is connected to a GND outside of the LSI 11. The GND 37 provides a ground signal to the GND 32 through a via hole 40 of the GND 37. A longitudinal row 38 denotes a power supply for the VDD wiring for the clock circuit 33. The power supply 38 is connected to a power source located outside of the LSI 11. The power supply 38 provides power to the VDD wiring for the clock circuit 33 through the via hole 40 of the power supply 38. A longitudinal row 39 denotes a power supply for the logic circuit 34. The power supply 39 is connected to a power source located outside of the LSI 11. The power supply 39 provides power to the VDD wiring for the logic circuit 34 through the via hole 40 of the power supply 39. The GND 37, the power supply 38 and the power supply 39 are disposed on a second layer which may be a different layer from the first layer.

The via hole 40 and a deleted via hole 41 are shown at the intersecting point of the VDD wiring for the logic circuit 31, the GND 32, and the VDD wiring for the clock circuit 33, and the GND 37, the power supply 38, and the power supply 39. The via hole 41 may not be present from the beginning.

In FIG. 3, in a shaded region (i.e., the region formed by the VDD wiring for the clock circuit 33 and two GNDs 32 which are close to the VDD wiring for the clock circuit 33), only the standard cell of the clock circuit 35 may be placed thereon. In an un-shaded region (i.e., the region formed by the GND 32 and two VDD wirings for the logic circuits which is close to the VDD wiring for the logic circuit 31), the logic circuit 34 may be placed thereon.

The GND 37, the power supply 38, and the power supply 39 of the longitudinal row are connected to the outside through a connecting portion made of a pad (not illustrated in FIG. 3) for wire bonding or soldering ball.

Although the LSI mounted with the semiconductor integrated circuit of the present exemplary embodiment is formed of two layers including the first layer and the second layer, it is not limited to a two-layer structure, but may be any layer structure if the first layer and the second layer can be separated.

Both the GND 32 for the logic circuit and the GND for the clock circuit are connected to the GND 37, and the GND 37 provides the ground signal to both the GND 32 for the logic circuit and the GND for the clock circuit. Therefore, the threshold value between the clock circuit and the logic circuit can be maintained consistently, so that the clock skew may be reduced.

Next, a design method when the LSI mounted with the semiconductor integrated circuit of the present exemplary embodiment is designed will be described.

1. First Exemplary Design Method:

The power supply 38 and the power supply 39 are defined with a different name, respectively (e.g., the power supply 38 is named "VDD-clock" and the power supply 39 is named "VDD-logic"). Then, the power supply 38 and 39 are merged with the VDD wiring for the logic circuit 31, the GND 32 and the VDD wiring for the clock circuit 33. These processes may be performed by CAD (computer-aided design).

2. Second Exemplary Design Method:

First, the power supply 39 for the logic circuit is formed, and the power supply 39 is connected with the VDD wiring for the logic circuit 31, the VDD wiring for the clock circuit 33 and the GND 32 through via hole 40. Then, the via hole 40 connected with the VDD wiring for the clock circuit 33 is deleted. The via hole 40 which is deleted, may be the deleted via hole 41. Then, the power supply 38 is connected to the VDD wiring for the clock circuit 33. These processes may be performed by CAD (computer-aided design)

Figure 4:
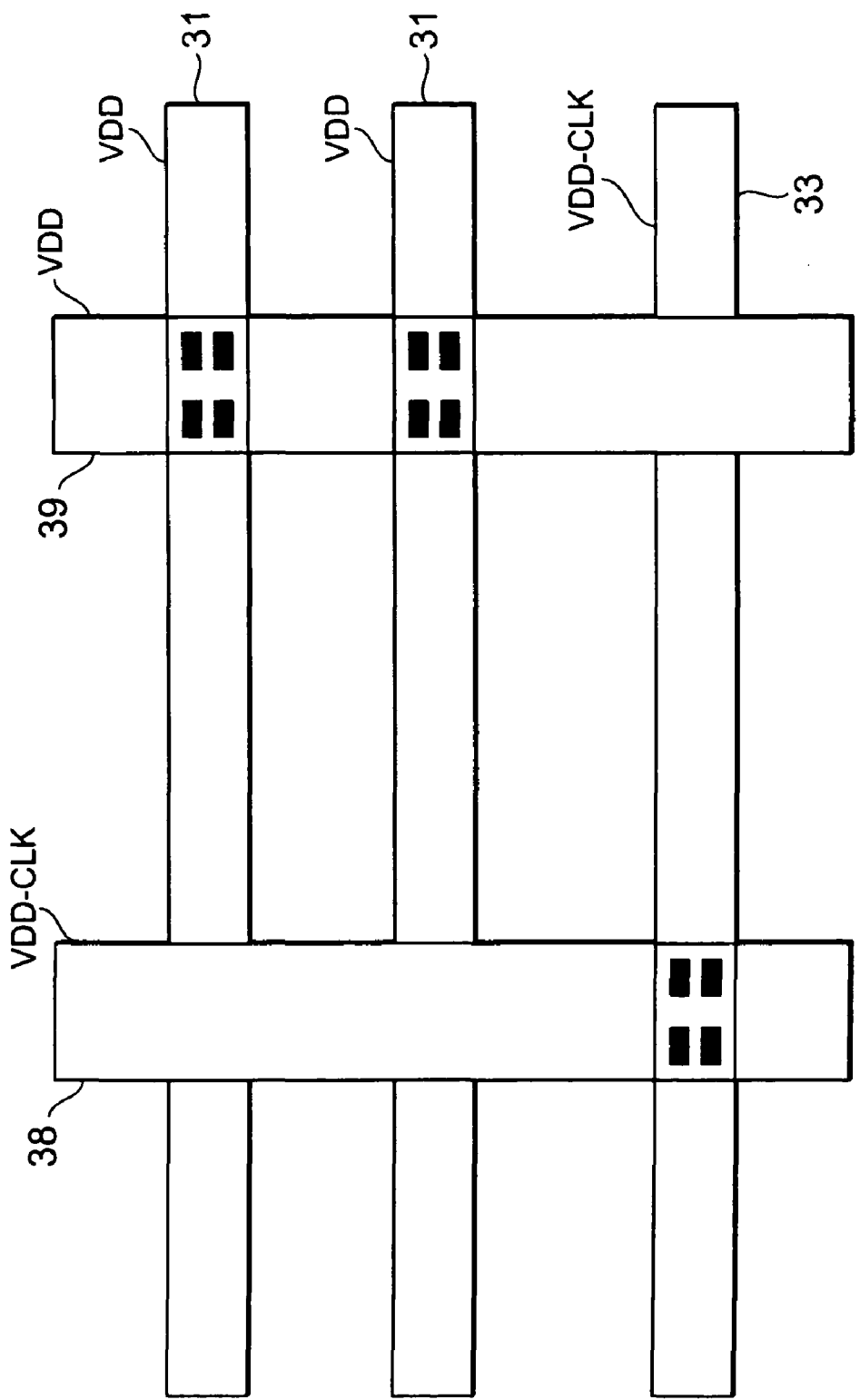
FIG. 4 shows an exemplary process for designing the present invention.

3. Third Exemplary Design Method:

First, as shown in FIG. 4, the power supply 38 to be connected to the power source for the clock circuit is named "VDD-CLK", for example. The power supply 39 to be connected to the power source for the logic circuit is named "VDD", for example. The VDD wiring for the logic circuit 31 is named "VDD", for example. The VDD wiring for the clock circuit 33 is named "VDD-CLK", for example.

Then, the power supply 39 and the VDD wiring 31 which have a same name (VDD) are connected through via hole 40 (not shown in FIG. 4) with each other. The power supply 38 named "VDD-CLK" is connected to the VDD wiring named "VDD-CLK". Then, the power supply (39) named "VDD" is connected to the VDD wiring (31) named "VDD". Since each name is different, the via hole 40 is formed exclusively. In other words, the via hole 40 is not formed at an intersection between the power supply named "VDD-CLK" and the VDD wiring named "VDD".

Figure 5:
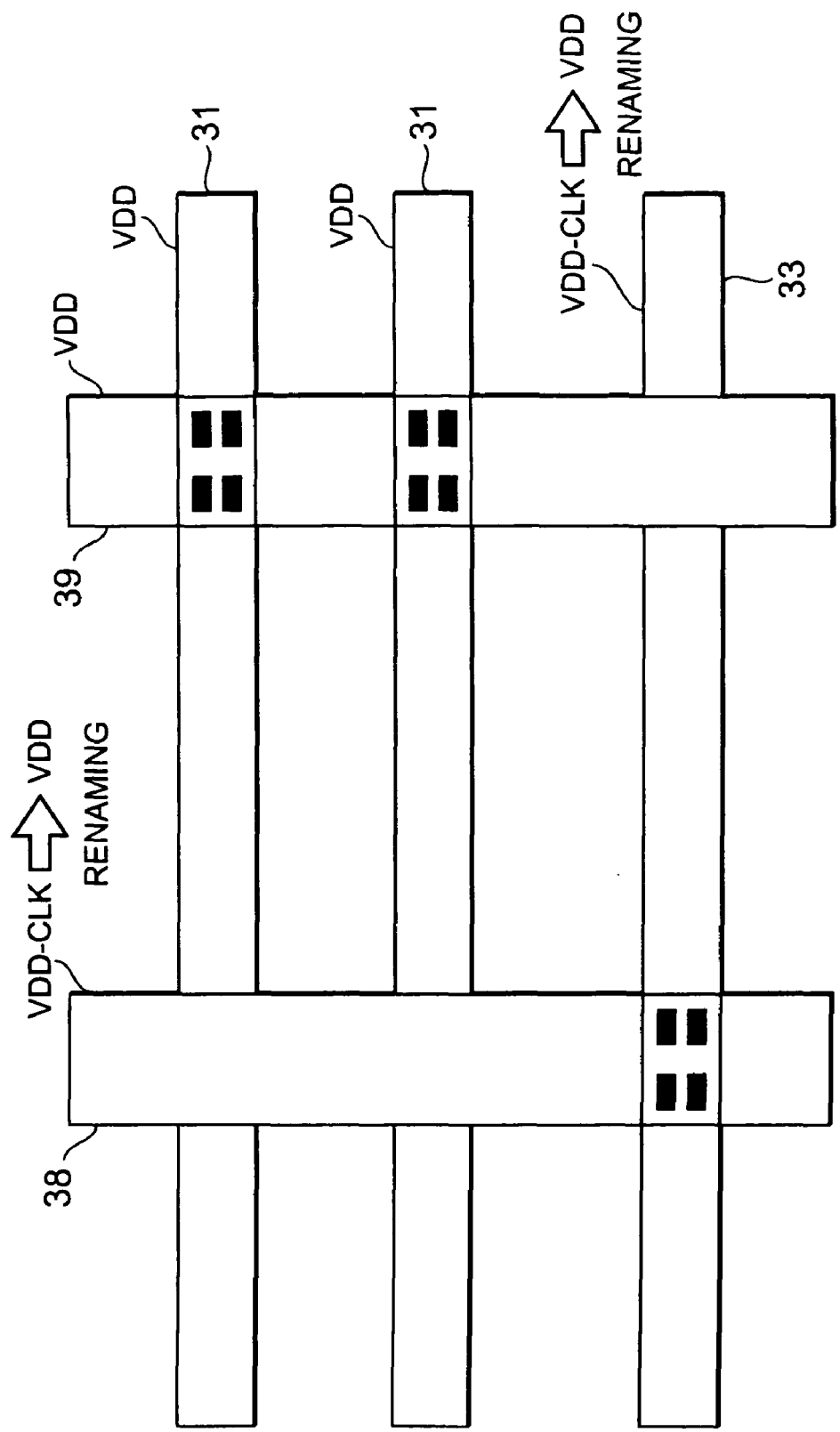
FIG. 5 shows an exemplary process for designing the present invention.
Figure 6:
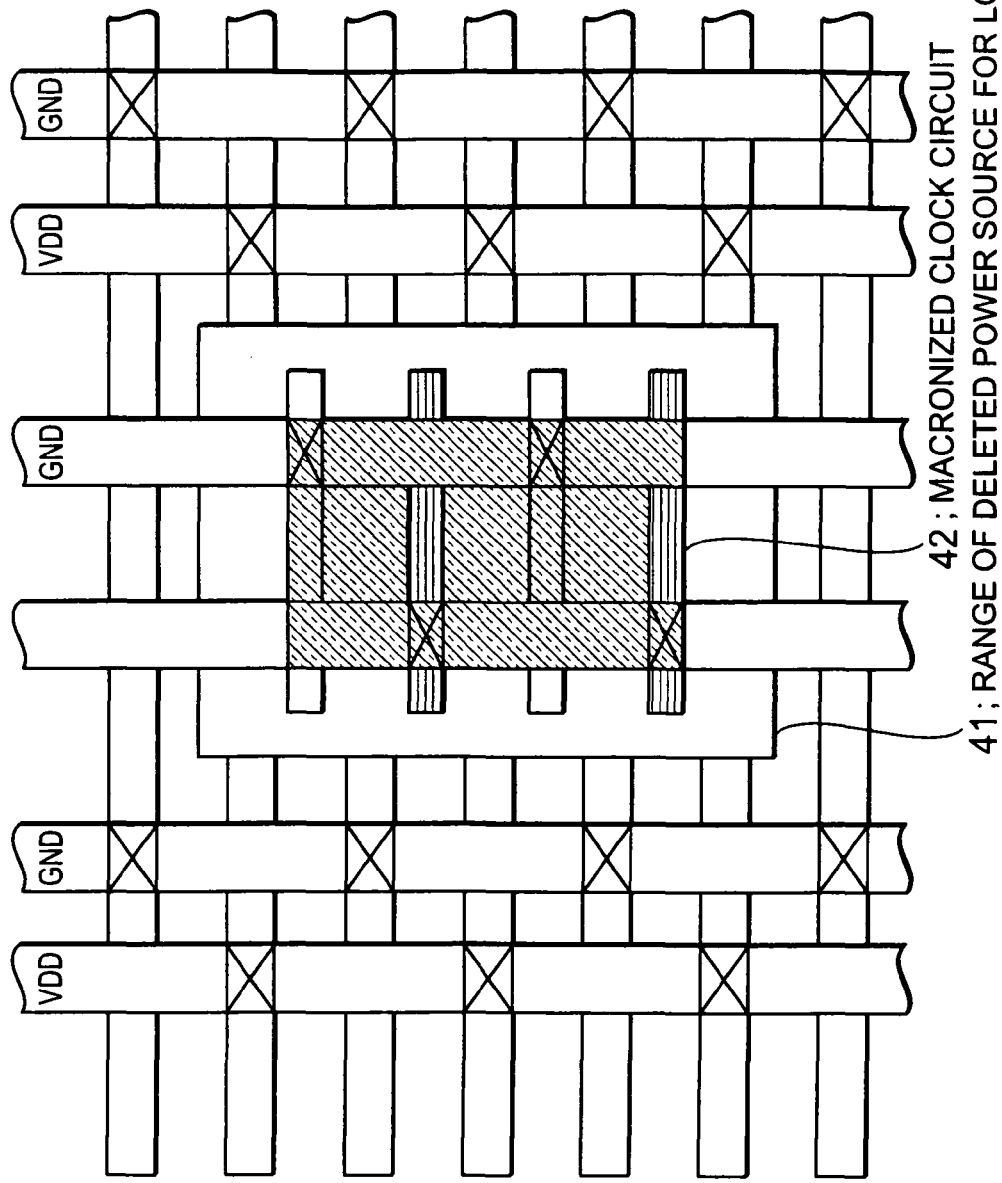
FIG. 6 shows a configuration of a related art.

Then, as shown in FIG. 5, the name "VDD-CLK" is renamed to "VDD".

The power supply 38, 39 have a same name. The power source for the clock circuit may be connected to the power supply 38 or the power supply 39, whichever is preferable. The clock circuit 35 may be connected to the VDD wiring 31 or the VDD wiring 33, whichever is preferable. Therefore, there may be no need to form the VDD wiring by distinguishing the VDD wiring for the logic circuit 31 and the VDD wiring for the clock circuit 33.

4. Fourth Exemplary Design Method:

The power supply 38 and 39, the VDD wiring for the logic circuit 31, and the VDD wiring for the clock circuit 33 are named "VDD", for example.

Then, these are connected with each other. When these are connected, an intersection between the power supply 39 for the logic circuit and the VDD wiring for the clock circuit 33 is masked, so that no via hole 40 is formed.

By the above mentioned exemplary methods, a structure for supplying the power separately to the logic circuit and the clock circuit is designed.

When the clock circuit 35 is laid out, an area along the VDD wiring for the logic circuit 31 is masked so that the clock circuit 35 is not laid out along the VDD wiring for the logic circuit 31 (a general tool of CAD has a function for masking a specific area). Therefore, the clock circuit 35 and the logic circuit 34 are laid out exclusively and separately (independently).

When the logic circuit 34 is laid out, an area along the VDD wiring for the clock circuit 33 is masked so that the logic circuit 34 is not laid out along the VDD wiring for the clock circuit 33 (a general tool of CAD has a function for masking a specific area.). Therefore, the clock circuit 35 and the logic circuit 34 are laid out exclusively and separately (independently).

When the logic circuit 34 is laid out, a fill cell is laid out along the VDD wiring for the clock circuit 33. The fill cell is used for preventing the logic circuit 34 from being laid out along the VDD wiring for the clock circuit 33. After laying out the logic circuit 34, the fill cell is replaced by the clock circuit 35. Therefore, the clock circuit 35 and the logic circuit 34 are laid out exclusively and separately (independently).

Further, when a fill cell is disposed in the area of the clock circuit 35 in advance and the clock circuit 35 is disposed, since the logic circuit is not disposed on the fill cell by never failing to replace the fill cell by the clock circuit, the clock circuit and the logic circuit can be separated and disposed exclusively.

Further, it is noted that applicant's intent is to encompass equivalents of all claim elements, even if amended later during prosecution.

What is claimed is:

1. An apparatus, comprising:
a plurality of wirings;
a first power supply to provide a first power to at least one of said wirings, said first power supply being connected to said at least one of said wirings;
a second power supply to provide a second power to at least one of said wirings that comprises a wiring of a clock circuit; and
a substrate which includes a first layer and a second layer,
wherein said wirings are laid out on said first layer,
wherein said first power supply and said second power supply are laid out on said second layer,
wherein said first power supply is connected to said at least one of said wirings through a first via hole, and
wherein said second power supply is connected to said at least least one of said wirings that comprises the wiring of the clock circuit, through a second via hole.

2. The apparatus according to claim 1, further comprising:
a first circuit being connected to said wiring which is connected to said first power supply; and
a second circuit being connected to said at least one of said wiring that comprises the wiring of the clock circuit.

3. The apparatus according to claim 2, wherein said second circuit comprises the clock circuit, and wherein said second power drives said clock circuit.

4. The apparatus according to claim 2, wherein said first circuit is laid out substantially parallel with respect to said at least one of said wirings which is connected to said first power supply, and
wherein said second circuit is laid out substantially parallel with respect to said at least one of said wirings that comprises the wiring of the clock circuit.

5. The apparatus according to claim 2, further comprising:
a ground signal supply to provide a ground signal to at least one of said wirings,
wherein said ground signal supply provides said ground signal to said first and second circuits through said wiring which is connected to said ground signal supply.

6. The apparatus according to claim 1, further comprising:
a ground signal supply to provide a ground signal to at least one of said wirings.

7. The apparatus according to claim 6, wherein said wiring connected to said ground signal supply forms a pair with each of said wirings which is connected to said first power supply, and with each of said wirings which is connected to said second power supply.

8. The apparatus according to claim 1, further comprising:
a deleted via hole disposed between said first power supply and said at least one of said wirings that comprises the wiring of the clock circuit.

9. The apparatus according to claim 1, wherein said first power supply and said second power supply are different from ground.

10. The apparatus according to claim 1, further comprising:
a phase locked loop that generates a clock signal,
wherein said at least one of said wirings that comprises the wiring of the clock circuit is connected to the phase locked loop.

11. The apparatus according to claim 10, wherein the phase locked loop performs a multiplication for an external clock to generate said clock signal for said wirings that comprises the wiring of the clock circuit.

12. The apparatus according to claim 10, further comprising:
at least one clock supply line to propagate the clock signal to the clock circuit.

13. The apparatus according to claim 1, wherein said apparatus comprises:
a first region comprising:
two wirings of said at least one of said wirings connected to said first power line; and
a ground wiring of said wirings located between said two wirings; and
a second region comprising:
two ground wirings of said wirings; and
said at least one of said wirings that comprises the wiring of the clock circuit, disposed between said two ground wirings.

14. The apparatus according to claim 1, wherein said wirings comprise:
a first wiring of said at least one of said wirings connected to said first power line;
a first ground wiring;
a second wiring of said at least one of said wirings connected to said first power line;
a second ground wiring;
said at least one of said wirings that comprises the wiring of the clock circuit, disposed between said two ground wirings; and
a third ground wiring, in that order.

15. The apparatus according to claim 1, wherein said wirings comprise:
said at least one of said wirings connected to said first power line;
at least one ground wiring; and
said at least one of said wirings that comprises the wiring of the clock circuit, disposed between said two ground wirings.

16. The apparatus according to claim 1, further comprising:
a logic circuit, said at least one of said wirings connected to said first power line providing power to said logic circuit.

17. A circuit, comprising;
a plurality of wirings;
a first power supply to provide a first power to at least one of said wirings, said first power supply being connected to said at least one of said wirings;
a second power supply to provide a second power to at least one of said wirings that comprises a wiring of a clock circuit; and
a substrate which includes a first layer and a second layer,
wherein said wirings are laid out on said first layer,
wherein said first power supply and said second power supply are laid out on said second layer,
wherein said first power supply is connected to said at least one of said wirings through a first via hole; and
wherein said second power supply is connected to said at least one of said wirings that comprises the wiring of the clock circuit, through a second via hole.

18. The circuit according to claim 17, further comprising:
a first circuit being connected to said wiring which is connected to said first power supply; and
a second circuit being connected to said at least one of said wirings that comprises the wiring of the clock circuit.

19. The circuit according to claim 18, wherein said second circuit comprises the clock circuit, and
wherein said second power drives said clock circuit.

20. The circuit according to claim 18, wherein said first circuit is laid out substantially parallel with respect to said at least one of said wirings which is connected to said first power supply, and
wherein said second circuit is laid out substantially parallel with respect to said at least one of said wirings that comprises the wiring of the clock circuit.

21. The circuit according to claim 18, further comprising:
a ground signal supply to provide a ground signal to at least one of said wirings,
wherein said ground signal supply provides said ground signal to said first and second circuits through said wiring which is connected to said ground signal supply.

22. The circuit according to claim 17, further comprising:
a ground signal supply to provide a ground signal to at least one of said wirings.

23. The circuit according to claim 22, wherein said wiring connected to said ground signal supply forms a pair with each of said wirings which is connected to said first power supply, and with each of said wirings which is connected to said second power supply.

24. A method, comprising:
laying out a plurality of wirings;
laying out a first power supply to provide a first power to at least one of said wirings, said first power supply being connected to said at least one of said wirings;
laying out a second power supply to provide a second power to at least one of said wirings that comprises a wiring of a clock circuit;
providing a substrate which includes a first layer and a second layer;
laying out said wirings on said first layer;
laying out said first power supply and said second power supply on said second layer;
connecting said first power supply to said at least one of said wirings through a first via hole; and
wiring said at least one of said wirings that comprises the wiring of the clock circuit, through a second via hole.

25. The method according to claim 24, further comprising:
connecting a first circuit to said wiring which is connected to said first power supply; and
connecting a second circuit to said at least one of said wirings that comprises the wiring of the clock circuit.

26. The method according to claim 25, wherein said second circuit comprises the clock circuit, and
wherein said second power drives said clock circuit.

27. The method according to claim 25, further comprising:
laying out said first circuit substantially parallel with respect to said at least one of said wirings which is connected to said first power supply; and
laying out said second circuit substantially parallel with respect to said at least one of said wirings that comprises the wiring of the clock circuit.

28. The method according to claim 25, further comprising:
laying out a ground signal supply to provide a ground signal to at least one of said wirings,
wherein said ground signal supply provides said ground signal to said first and second circuits through said wiring which is connected to said ground signal supply.

29. The method according to claim 25, further comprising:
laying out said first circuit and said second circuit exclusively to each other.

30. The method according to claim 24, further comprising:
laying out a ground signal supply to provide a ground signal to at least one of said wirings.

31. The method according to claim 30, further comprising:
laying out said wiring connected to said ground signal supply so that said wiring connected to said ground signal forms a pair with each of said wirings which is connected to said first power supply, and with each of said wirings which is connected to said second power supply.

32. The method according to claim 24, further comprising:
providing a substrate which includes a first layer and a second layer;
laying out said wirings on said first layer;
laying out said first power supply and said second power supply on said second layer;
connecting said first power supply to said at least one of said wirings through a first via hole;
deleting said first via hole of said wiring to be connected to said second power supply; and
connecting said second power supply to said at least one of said wirings that comprises the wiring of the clock circuit, through a second via hole.

* * * * *